United States Patent
Kang

(10) Patent No.: US 7,710,194 B2
(45) Date of Patent: May 4, 2010

(54) VOLTAGE PUMPING DEVICE

(75) Inventor: Dong Keum Kang, Cheonan-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 28 days.

(21) Appl. No.: 11/818,640

(22) Filed: Jun. 15, 2007

(65) Prior Publication Data

US 2008/0159015 A1 Jul. 3, 2008

(30) Foreign Application Priority Data

Dec. 29, 2006 (KR) .................. 10-2006-0138767

(51) Int. Cl.
*G05F 1/10* (2006.01)

(52) U.S. Cl. .................. 327/536; 327/535; 327/589

(58) Field of Classification Search .................. 327/148, 327/157, 534–538, 589, 540, 541, 543; 363/59–60
See application file for complete search history.

(56) References Cited

U.S. PATENT DOCUMENTS

| | | | | |
|---|---|---|---|---|
| 5,264,808 A | * | 11/1993 | Tanaka | .................. 331/57 |
| 5,798,667 A | * | 8/1998 | Herbert | .................. 327/573 |
| 5,999,009 A | * | 12/1999 | Mitsui | .................. 324/765 |
| 6,414,881 B1 | * | 7/2002 | Fujii et al. | .................. 365/189.09 |
| 6,661,278 B1 | | 12/2003 | Gilliland | |
| 6,774,709 B2 | | 8/2004 | Castaldo et al. | |
| 2005/0248385 A1 | * | 11/2005 | Lee et al. | .................. 327/528 |
| 2006/0192610 A1 | * | 8/2006 | Hirobe et al. | .................. 327/540 |

FOREIGN PATENT DOCUMENTS

| | | |
|---|---|---|
| KR | 10-2000-0004723 A | 1/2000 |
| KR | 10-2004-0093816 A | 11/2004 |
| KR | 10-2004-0095893 A | 11/2004 |

OTHER PUBLICATIONS

Neil H.E. Weste and David Harris, CMOS VLSI Design: A Circuits and Systems Perspective, Dec. 31, 2005, Pearson Education Inc. and Addison Wesley, pp. 75, 103, and 175.

* cited by examiner

*Primary Examiner*—Long Nguyen
*Assistant Examiner*—Sibin Chen
(74) *Attorney, Agent, or Firm*—John P. White; Cooper & Dunham LLP

(57) ABSTRACT

A voltage pumping device for generating a high voltage that is a boosted voltage is disclosed. The voltage pumping device includes an oscillator for generating a first pulse signal or second pulse signal in response to a control signal, and a high voltage pump for pumping a high voltage of a constant level in response to the first pulse signal or second pulse signal.

18 Claims, 4 Drawing Sheets

VOLTAGE PUMPING DEVICE

CROSS-REFERENCES TO RELATED APPLICATIONS

The present application claims priority to Korean patent application number 10-2006-0138767, filed Dec. 29, 2006, which is incorporated by reference in its entirety.

BACKGROUND OF THE INVENTION

The present invention relates to a semiconductor memory device, and more particularly to a voltage pumping device for generating a high voltage that is a boosted voltage.

In general, a DRAM is a random access memory in which data can be read/written from/into a memory cell consisting of one transistor and one capacitor. In the DRAM, an n-channel metal oxide semiconductor (NMOS) transistor is used as the transistor constituting the memory cell. In order to turn on this NMOS transistor to read or write data from or into the cell, it is necessary to apply a boosted voltage of VDD+Vt or higher to the gate of the NMOS transistor.

Therefore, in order to drive word lines of the DRAM device, there is a need for a voltage pumping device that generates a high voltage VPP, which is the boosted voltage.

FIG. 1 is a block diagram showing the configuration of a conventional voltage pumping device.

As shown in FIG. 1, the voltage pumping device includes an oscillator 100 for generating a pulse signal VPOSC in response to a high voltage pumping enable signal Enable, and a high-voltage pump 200 for pumping a high-voltage VPP in response to the pulse signal VPOSC from the oscillator 100. With this configuration, the voltage pumping device generates the high voltage VPP.

On the other hand, the high voltage VPP is frequently used in an auto-refresh operation, among a plurality of operations of the DRAM. Particularly, the high voltage VPP is more frequently used when a low supply voltage VDD is applied or when an auto-refresh period tRFC is short.

FIG. 2 illustrates a practical drop in the high voltage VPP resulting from the use of a large amount of current when the low supply voltage VDD is applied or when the auto-refresh period tRFC is short. The supply voltage VDD may be dropped due to the frequent use of an internal voltage Vint, thereby adversely affecting other peripheral circuits using the supply voltage VDD.

That is, the drop of the supply voltage VDD results in a level reduction in the internal voltage Vint which is used as a drive voltage of the oscillator 100 generating a pumping period of the high voltage pump 200. For this reason, the period of a pulse outputted from the oscillator 100 becomes longer, thus degrading a high voltage pumping capability.

Consequently, a high voltage driving capability is degraded, resulting in a faulty operation of the DRAM.

BRIEF SUMMARY OF THE INVENTION

In an aspect of the present invention, a voltage pumping device comprises: an oscillator for generating a first pulse signal or second pulse signal in response to a control signal; and a high voltage pump for pumping a high voltage of a constant level in response to the first pulse signal or second pulse signal.

The control signal may be made active when a supply voltage has a low voltage level.

The second pulse signal may have a period shorter than that of the first pulse signal.

In another aspect of the present invention, a voltage pumping device comprises: a low voltage level detector for detecting a level of a supply voltage; a controller for outputting a control signal in response to an output signal from the low voltage level detector; an oscillator for generating a first pulse signal or second pulse signal in response to the control signal from the controller; and a high voltage pump for pumping a high voltage of a constant level in response to the first pulse signal or second pulse signal.

In yet another aspect of the present invention, a voltage pumping device comprises: a high voltage level detector for detecting a level of a high voltage fed back thereto; a first controller for outputting an enable signal in response to an output signal from the high voltage level detector; a low voltage level detector for detecting a level of a supply voltage; a second controller for outputting a control signal in response to an output signal from the low voltage level detector; an oscillator for generating a first pulse signal or second pulse signal in response to the control signal from the second controller; and a high voltage pump for pumping a high voltage of a constant level in response to the first pulse signal or second pulse signal and feeding the pumped high voltage back to the high voltage level detector.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Preferred embodiments of the present invention will now be described in detail with reference to the accompanying drawings.

A voltage pumping device according to the present invention can improve a high voltage supply capability when a low supply voltage is applied thereto. In addition, this voltage pumping device shortens a pulse period of an oscillator to improve operating characteristics of a high voltage pump. Therefore, it is possible to avoid a faulty operation of a DRAM resulting from a drop of a high voltage.

Figure 1:
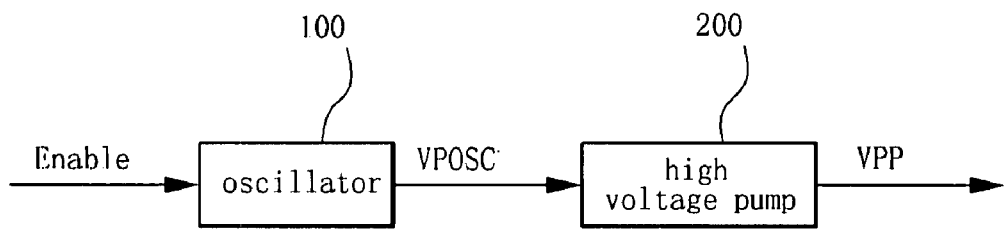
FIG. 1 is a block diagram showing the configuration of a conventional voltage pumping device.
Figure 2:
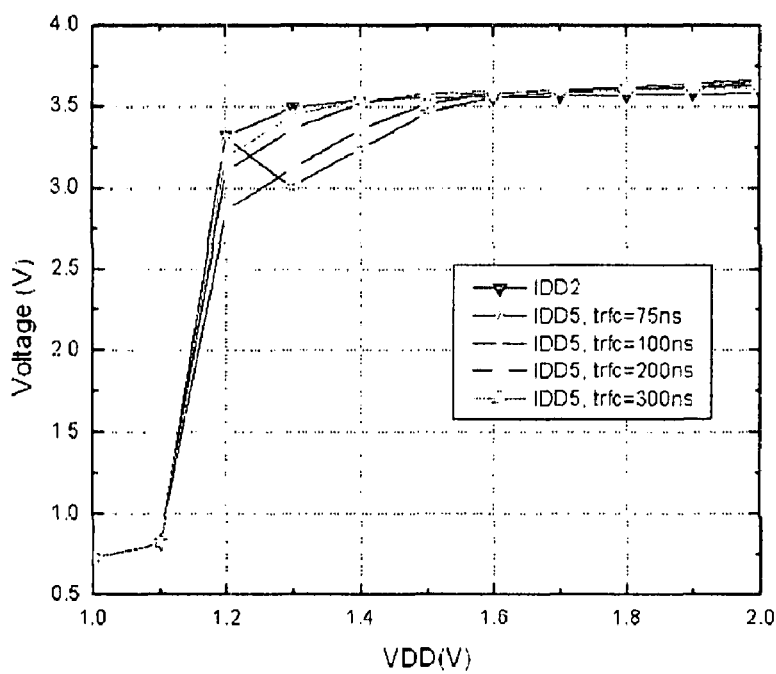
FIG. 2 is a graph illustrating high voltage generation characteristics of the voltage pumping device of FIG. 1 in a refresh period.
Figure 3:
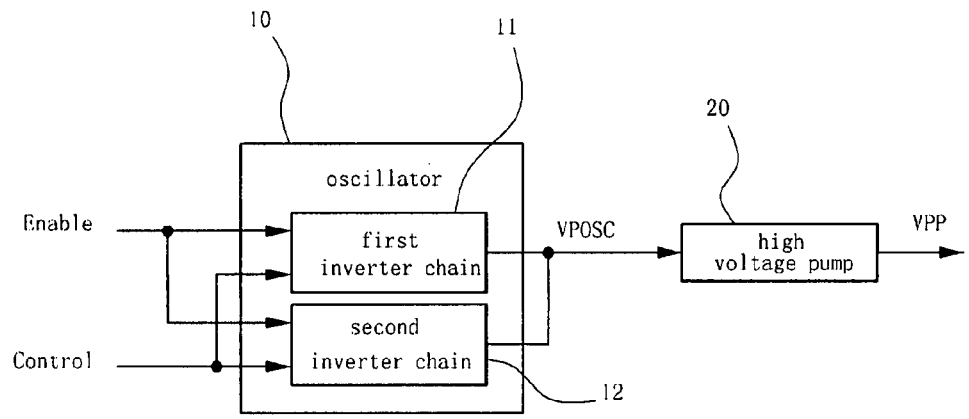
FIG. 3 is a block diagram showing the configuration of a voltage pumping device according to an embodiment of the present invention.
Figure 4:
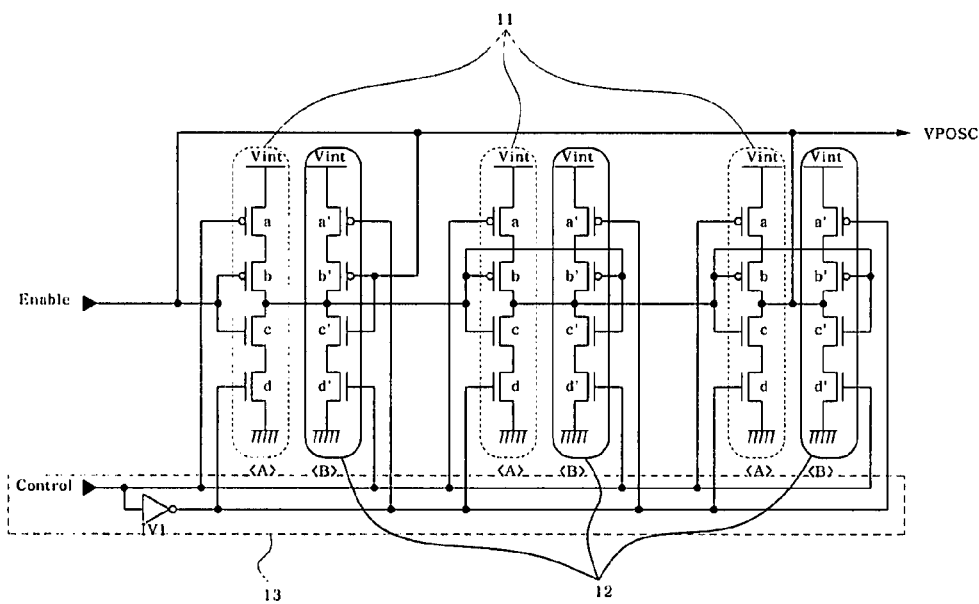
FIG. 4 is a detailed circuit diagram of an oscillator in FIG. 3.

FIG. 3 is a block diagram showing the configuration of a voltage pumping device according to an embodiment of the present invention, and FIG. 4 is a detailed circuit diagram of an oscillator in FIG. 3.

As shown in FIG. 3, the voltage pumping device according to this embodiment comprises an oscillator 10 for generating a first pulse signal or second pulse signal in response to a control signal Control which is made active when a supply voltage VDD inputted to the voltage pumping device has a low voltage level, and a high voltage pump 20 for pumping a high voltage VPP of a constant level in response to the first pulse signal or second pulse signal.

Here, the second pulse signal has a period shorter than that of the first pulse signal.

As shown in FIG. 4, the oscillator 10 includes a first inverter chain 11 for generating the first pulse signal in response to an enable signal Enable, a second inverter chain 12 for generating the second pulse signal in response to the enable signal Enable, and a driver 13 for driving the first inverter chain 11 or second inverter chain 12 in response to the control signal Control.

The enable signal Enable is a high voltage pumping enable signal which is made active when the level of the high voltage VPP pumped by the high voltage pump 20 falls to a predetermined level.

The first inverter chain 11 has the same transistor channel width as that of the second inverter chain 12, and the second inverter chain 12 has a transistor channel length shorter than that of the first inverter chain 11. Each of the first inverter chain 11 and second inverter chain 12 includes an odd number of inverters.

The driver 13 acts to drive the second inverter chain 12 when the control signal Control is made active. To this end, the driver 13 includes an inverter IV1 for outputting a signal to drive the first inverter chain 11 or second inverter chain 12 in response to the control signal Control.

Figure 5:
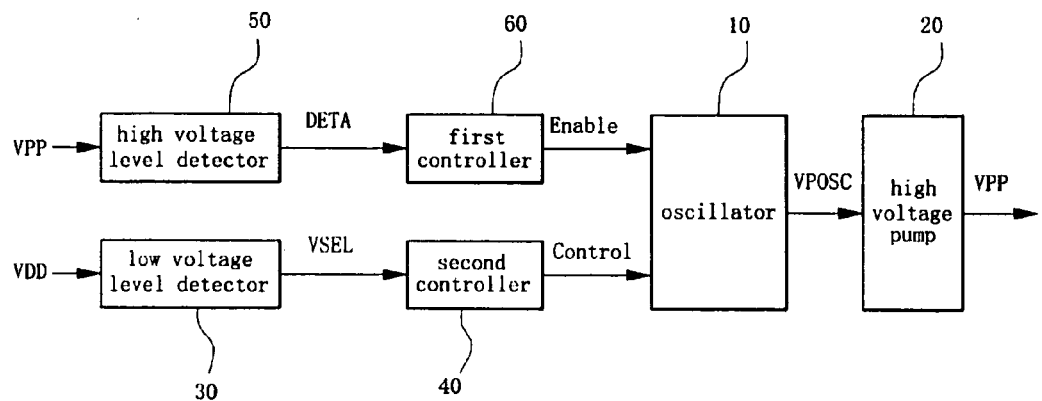
FIG. 5 is a block diagram showing the configuration of a voltage pumping device according to an alternative embodiment of the present invention.
Figure 6:
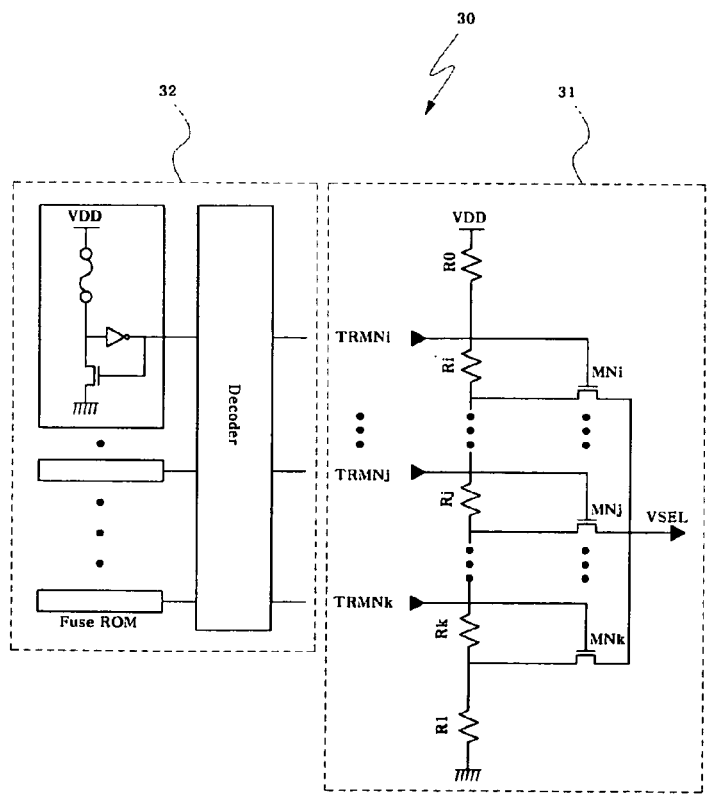
FIG. 6 is a detailed circuit diagram of a low voltage level detector in FIG. 5.
Figure 7:
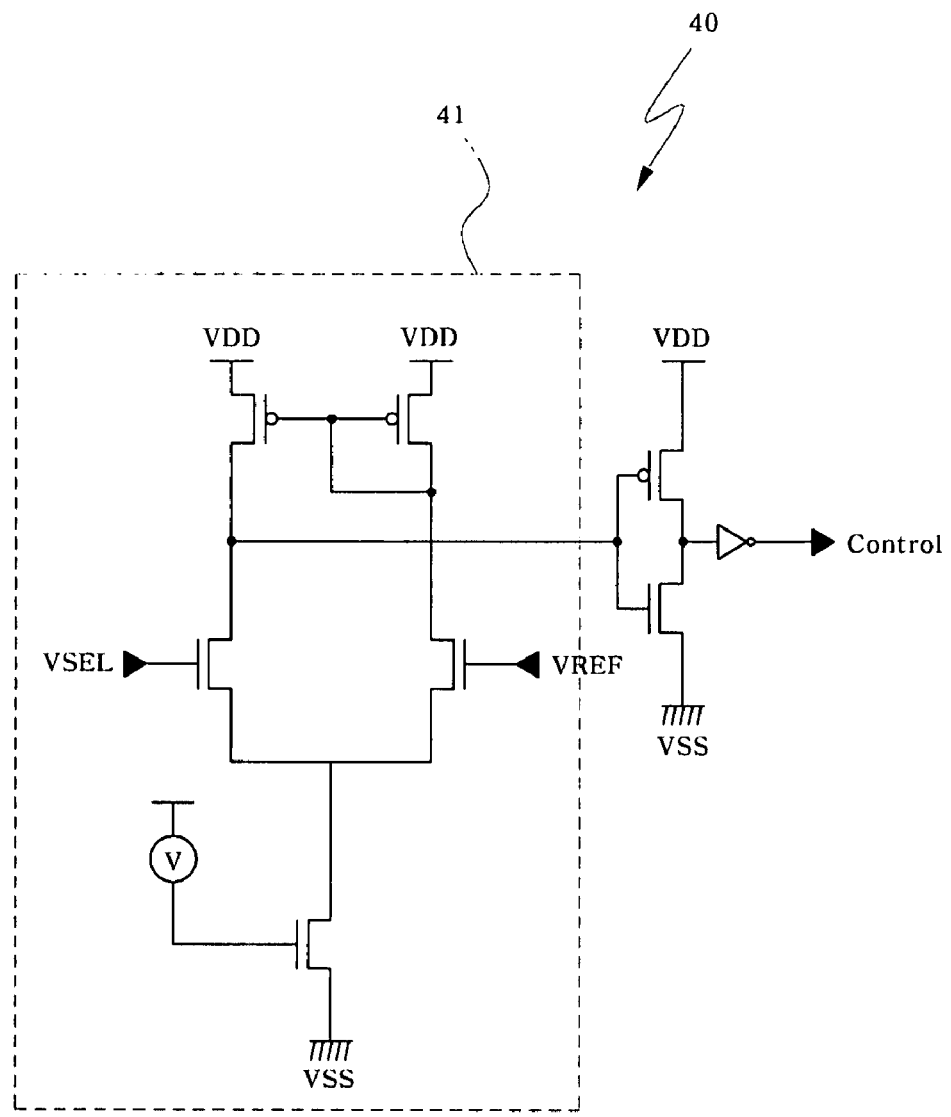
FIG. 7 is a detailed circuit diagram of a controller in FIG. 5.

FIG. 5 is a block diagram showing the configuration of a voltage pumping device according to an alternative embodiment of the present invention, FIG. 6 is a detailed circuit diagram of a low voltage level detector in FIG. 5, and FIG. 7 is a detailed circuit diagram of a controller in FIG. 5.

As shown in FIG. 5, the voltage pumping device according to the present embodiment comprises a high voltage level detector 50 for detecting the level of a high voltage VPP fed back from a high voltage pump 20, a first controller 60 for outputting an enable signal Enable in response to an output signal DETA from the high voltage level detector 50, a low voltage level detector 30 for detecting the level of a supply voltage VDD, a second controller 40 for outputting a control signal Control in response to an output signal VSEL from the low voltage level detector 30, and an oscillator 10 for generating a first pulse signal or second pulse signal in response to the control signal Control from the second controller 40. The high voltage pump 20 is further provided in the voltage pumping device to pump the high voltage VPP of a constant level in response to an output signal VPOSC from the oscillator 10.

Here, the control signal Control is made active when the supply voltage VDD has a low voltage level, and the second pulse signal has a period shorter than that of the first pulse signal.

As shown in FIG. 6, the low voltage level detector 30 includes a voltage divider 31 for dividing the supply voltage VDD, and a decoder 32 for outputting a switching signal based on a fuse cut to select any one of divided voltages from the voltage divider 31. The voltage divider 31 includes a plurality of NMOS drivers MNi-MNk which are turned on in response to switching signals TRMNi-TRMNk from the decoder 32, respectively.

As shown in FIG. 7, the second controller 40 includes a comparator 41 for comparing the output signal VSEL from the low voltage level detector 30 with a reference voltage VREF with a predetermined level and outputting a logic signal of a certain level as a result of the comparison. The comparator 41 outputs a 'high' logic signal when the output signal VSEL from the low voltage level detector 30 is lower than the reference voltage VREF, and a 'low' logic signal when the output signal VSEL from the low voltage level detector 30 is higher than the reference voltage VREF.

As shown in FIG. 4, the oscillator 10 includes a first inverter chain 11 for generating the first pulse signal in response to the enable signal Enable, a second inverter chain 12 for generating the second pulse signal in response to the enable signal Enable, and a driver 13 for driving the first inverter chain 11 or second inverter chain 12 in response to the control signal Control.

The enable signal Enable is a high voltage pumping enable signal which is made active when the level of the high voltage VPP pumped by the high voltage pump 20 falls to a predetermined level.

The first inverter chain 11 has the same transistor channel width as that of the second inverter chain 12, and the second inverter chain 12 has a transistor channel length shorter than that of the first inverter chain 11. Each of the first inverter chain 11 and second inverter chain 12 includes an odd number of inverters.

The driver 13 functions to drive the second inverter chain 12 when the control signal Control is made active. To this end, the driver 13 includes an inverter IV1 for outputting a signal to drive the first inverter chain 11 or second inverter chain 12 in response to the control signal Control.

The operation of the present invention configured as stated above will hereinafter be described with reference to FIGS. 3 to 7.

As shown in FIGS. 3 and 4, the oscillator 10 generates the pulse signal VPOSC in response to the enable signal Enable and the control signal Control. In detail, in the oscillator 10, the first inverter chain 11 generates the first pulse signal in response to the enable signal Enable, and the second inverter chain 12 generates the second pulse signal in response to the enable signal Enable. Here, the first inverter chain 11 and the second inverter chain 12 are driven in response to the output signal from the driver 13.

The control signal Control is made active when the supply voltage VDD has a low voltage level, and the enable signal Enable is a high voltage pumping enable signal which is made active when the level of the high voltage VPP falls to a predetermined level.

For example, when the control signal Control and the enable signal Enable are activated, the driver 13 drives the second inverter chain 12, as shown in FIG. 4. At this time, the second inverter chain 12 outputs the second pulse signal. Namely, because the second inverter chain 12 has a transistor channel length shorter than that of the first inverter chain 11, the second inverter chain 12 outputs the second pulse signal whose period is shorter than that of the first pulse signal whenever it is driven.

In other words, in the case where the supply voltage VDD is LOW, the control signal Control is made active, thereby causing transistors a-d of the first inverter chain 11 (a path <A> in FIG. 4) to be turned off and transistors a'-d' of the second inverter chain 12 (a path <B> in FIG. 4) to be turned on. As a result, the oscillator 10 is operated with the second inverter chain 12 whose transistor channel length is shorter than that of the first inverter chain 11.

Conversely, in the case where the supply voltage VDD is HIGH, the control signal Control is made inactive, so that the transistors a-d of the first inverter chain 11 (the path <A> in FIG. 4) are turned on and the transistors a'-d' of the second inverter chain 12 (the path <B> in FIG. 4) are turned off. As a result, the oscillator 10 is operated with the first inverter chain 11 whose transistor channel length is longer than that of the second inverter chain 12.

That is, in the case of the low supply voltage VDD level, the oscillation is carried out by the second inverter chain with an odd number of inverters whose channel length is shorter than that in the case of the high supply voltage VDD level, so that the pulse period becomes shorter than that in the case of the high supply voltage VDD level.

In this manner, when the supply voltage VDD falls to a low voltage level, the oscillator 10 shortens an oscillation period thereof to generate a pulse signal with a shorter period, and the high voltage pump 20 pumps the high voltage VPP in response to the pulse signal with the shorter period, so that operating characteristics of the high voltage pump 20 are improved.

Next, the operation of generating the control signal Control will be described with reference to FIGS. 6 and 7.

As shown in FIG. 6, the decoder 32 in the low voltage level detector 30 outputs any one of the switching signals TRMNi-TRMNk based on a fuse cut to select a corresponding one of the divided voltages from the voltage divider 31.

Then, a corresponding one of the NMOS drivers MNi-MNk in the voltage divider 31 is turned on in response to the switching signal outputted from the decoder 32.

That is, the voltage divider 31 outputs a divided voltage VSEL of the supply voltage VDD in response to the switching signals TRMNi-TRMNk.

As shown in FIG. 7, the comparator 41 compares the divided voltage VSEL from the low voltage level detector 30 with a reference voltage VREF with a predetermined level and outputs a logic signal of a certain level as a result of the comparison.

At this time, the comparator 41 outputs a 'high' logic signal when the output signal VSEL from the low voltage level detector 30 is lower than the reference voltage VREF, and a 'low' logic signal when the output signal VSEL from the low voltage level detector 30 is higher than the reference voltage VREF.

That is, the comparator 41 determines whether the inputted supply voltage has a low voltage level by comparing the divided voltage VSEL of the supply voltage with the reference voltage VREF with the predetermined level.

As apparent from the above description, according to the present invention, when a low supply voltage is applied, a pulse period of an oscillator is shortened to improve a high voltage supply capability of a high voltage pump. Therefore, it is possible to avoid a faulty operation of a DRAM resulting from a drop of a high voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A voltage pumping device comprising:
a low voltage level detector configured to detect a level of a supply voltage;
a controller configured to output a control signal which has a first logic signal when an output signal from the low voltage level detector is lower than a reference voltage, and a second logic signal when the output signal from the low voltage level detector is higher than the reference voltage;
an oscillator configured to generate a first pulse signal or second pulse signal in response to the control signal, which is made active when the supply voltage has a low voltage level, and an enable signal, which is made active when the level of a high voltage falls to a predetermined level, the first pulse signal and the second pulse signal having different pulse widths; and
a high voltage pump configured to pump the high voltage of a constant level in response to the first pulse signal or second pulse signal.

2. The voltage pumping device according to claim 1, wherein the second pulse signal has a period shorter than that of the first pulse signal.

3. The voltage pumping device according to claim 1, wherein the low voltage level detector comprises:
a voltage divider for dividing the supply voltage; and
a decoder for outputting a switching signal based on a fuse cut to select any one of divided voltages from the voltage divider.

4. The voltage pumping device according to claim 1, wherein the oscillator comprises:
a first inverter chain for generating the first pulse signal in response to an enable signal;
a second inverter chain for generating the second pulse signal in response to the enable signal; and
a driver for driving the first inverter chain or second inverter chain in response to the control signal from the controller.

5. The voltage pumping device according to claim 4, wherein the enable signal is a high voltage pumping enable signal which is made active when the level of the high voltage pumped by the high voltage pump falls to a predetermined level.

6. The voltage pumping device according to claim 4, wherein the first inverter chain has the same transistor channel width as that of the second inverter chain, and the second inverter chain has a transistor channel length shorter than that of the first inverter chain.

7. The voltage pumping device according to claim 4, wherein each of the first inverter chain and second inverter chain comprises an odd number of inverters.

8. The voltage pumping device according to claim 4, wherein the driver drives the second inverter chain when the control signal is made active.

9. The voltage pumping device according to claim 4, wherein the driver comprises an inverter for outputting a drive signal to the first inverter chain or second inverter chain in response to the control signal.

10. A voltage pumping device comprising:
a high voltage level detector configured to detect a level of a high voltage fed back thereto;
a first controller configured to output an enable signal in response to an output signal from the high voltage level detector;
a low voltage level detector configured to detect a level of a supply voltage;
a second controller configured to output a control signal which has a first logic signal when an output signal from the low voltage level detector is lower than a reference voltage, and a second logic signal when the output signal from the low voltage level detector is higher than the reference voltage;
an oscillator configured to generate a first pulse signal or second pulse signal in response to the control signal, which is made active when the supply voltage has a low voltage level, and an enable signal, which is made active when the level of the high voltage falls to a predetermined level, the first pulse signal and the second pulse signal having different pulse widths; and a high voltage pump configured to pump the high voltage of a constant level in response to the first pulse signal or second pulse signal and feeding the pumped high voltage back to the high voltage level detector.

11. The voltage pumping device according to claim 10, wherein the enable signal is a high voltage pumping enable signal which is made active when the high voltage level falls to a predetermined level.

12. The voltage pumping device according to claim 10, wherein the second pulse signal has a period shorter than that of the first pulse signal.

13. The voltage pumping device according to claim 10, wherein the low voltage level detector comprises:
   a voltage divider for dividing the supply voltage; and
   a decoder for outputting a switching signal based on a fuse cut to select any one of divided voltages from the voltage divider.

14. The voltage pumping device according to claim 10, wherein the oscillator comprises:
   a first inverter chain for generating the first pulse signal in response to the enable signal;
   a second inverter chain for generating the second pulse signal in response to the enable signal; and
   a driver for driving the first inverter chain or second inverter chain in response to the control signal from the second controller.

15. The voltage pumping device according to claim 14, wherein the first inverter chain has the same transistor channel width as that of the second inverter chain, and the second inverter chain has a transistor channel length shorter than that of the first inverter chain.

16. The voltage pumping device according to claim 14, wherein each of the first inverter chain and second inverter chain comprises an odd number of inverters.

17. The voltage pumping device according to claim 14, wherein the driver drives the second inverter chain when the control signal is made active.

18. The voltage pumping device according to claim 14, wherein the driver comprises an inverter for outputting a drive signal to the first inverter chain or second inverter chain in response to the control signal.

\* \* \* \* \*